(12) United States Patent
Colli

(10) Patent No.: US 8,232,544 B2
(45) Date of Patent: Jul. 31, 2012

(54) NANOWIRE

(75) Inventor: Alan Colli, Cambridge (GB)

(73) Assignee: Nokia Corporation (FI)

( * ) Notice: Subject to any disclaimer, the term of this patent is extended or adjusted under 35 U.S.C. 154(b) by 1088 days.

(21) Appl. No.: 12/080,790

(22) Filed: Apr. 4, 2008

(65) Prior Publication Data

US 2009/0250689 A1 Oct. 8, 2009

(51) Int. Cl.
*H01L 29/06* (2006.01)
*H01L 29/08* (2006.01)
*H01L 29/76* (2006.01)

(52) U.S. Cl. ............. 257/30; 257/314; 257/E51.04; 977/762; 977/938

(58) Field of Classification Search .......... 257/30, 257/314, E51.04; 977/762, 938
See application file for complete search history.

(56) References Cited

U.S. PATENT DOCUMENTS

| | | | |
|---|---|---|---|
| 6,995,649 B2 | 2/2006 | Nugent | |
| 7,129,554 B2 | 10/2006 | Lieber et al. | |
| 7,394,118 B2 * | 7/2008 | Zhou | 257/253 |
| 7,662,652 B2 * | 2/2010 | Zhou | 438/49 |
| 7,723,789 B2 * | 5/2010 | Lin et al. | 257/349 |
| 7,820,064 B2 * | 10/2010 | Jin | 216/41 |
| 7,910,932 B2 * | 3/2011 | Marks et al. | 257/72 |
| 7,960,718 B2 * | 6/2011 | Fink et al. | 257/40 |
| 2004/0031975 A1 * | 2/2004 | Kern et al. | 257/213 |
| 2005/0247961 A1 * | 11/2005 | Zhou | 257/213 |
| 2008/0173865 A1 * | 7/2008 | Fink et al. | 257/40 |
| 2008/0237684 A1 * | 10/2008 | Specht et al. | 257/316 |
| 2009/0001352 A1 * | 1/2009 | Han et al. | 257/24 |
| 2009/0050876 A1 * | 2/2009 | Marks et al. | 257/24 |
| 2009/0065852 A1 * | 3/2009 | Lin et al. | 257/326 |
| 2010/0184104 A1 * | 7/2010 | Fahmy et al. | 435/7.92 |
| 2010/0276667 A1 * | 11/2010 | Kim et al. | 257/24 |
| 2010/0297608 A1 * | 11/2010 | Stern et al. | 435/5 |
| 2011/0018053 A1 * | 1/2011 | Lo et al. | 257/325 |

OTHER PUBLICATIONS

Qianxi Lai, et al; "An Organic/Si Nanowire Hybrid Field Configurable Transistor"; 2008 American Chemical Society, published on Web Feb. 12, 2008; Nano Letters 2008, vol. 8, No. 3, pp. 876-880.
K. Byon, et al.; "Synthesis and postgrowth doping of silicon nanowires"; 2005 American Institute of Physics; Applied Physics Letters 87, 193104 (2005); whole document.
Xiangfeng Duan, et al; "Nonvolatile Memory and Programmable Logic from Molecule-Gated Nanowires"; 2002 American Chemical Society; published on Web Apr. 3, 2002; Nano Letters 2002, vol. 2, No. 5, pp. 487-490.
Walter M. Weber, et al; "Silicon-Nanowire Transistors with Intruded Nickel-Silicide Contacts"; 2006 American Chemical Society, published on Web Nov. 9, 2006; Nano Letters 2006, vol. 6, No. 12, pp. 2660-2666.
A. Colli, et al; "Thermal and chemical vapor deposition of Si Nanowires: Shape control, dispersion, and electrical properties"; 2007 American Institute of Physics; Journal of Applied Physics 102, 034302 (2007); whole document.

* cited by examiner

*Primary Examiner* — Ngan Ngo

(74) *Attorney, Agent, or Firm* — Alston & Bird LLP

(57) ABSTRACT

A method comprises applying a first electric field pulse to a nanowire comprising a channel and a charge trapping region configured to control conductivity of the channel, the first electric field pulse having a first polarity and a relatively large magnitude of integral of electric field during the pulse and, thereafter, applying at least one further electric field pulse to the nanowire, each further electric pulse having a second, opposite polarity and each respective further electric field pulse having a relatively small magnitude of integral of electric field during the pulse.

23 Claims, 11 Drawing Sheets

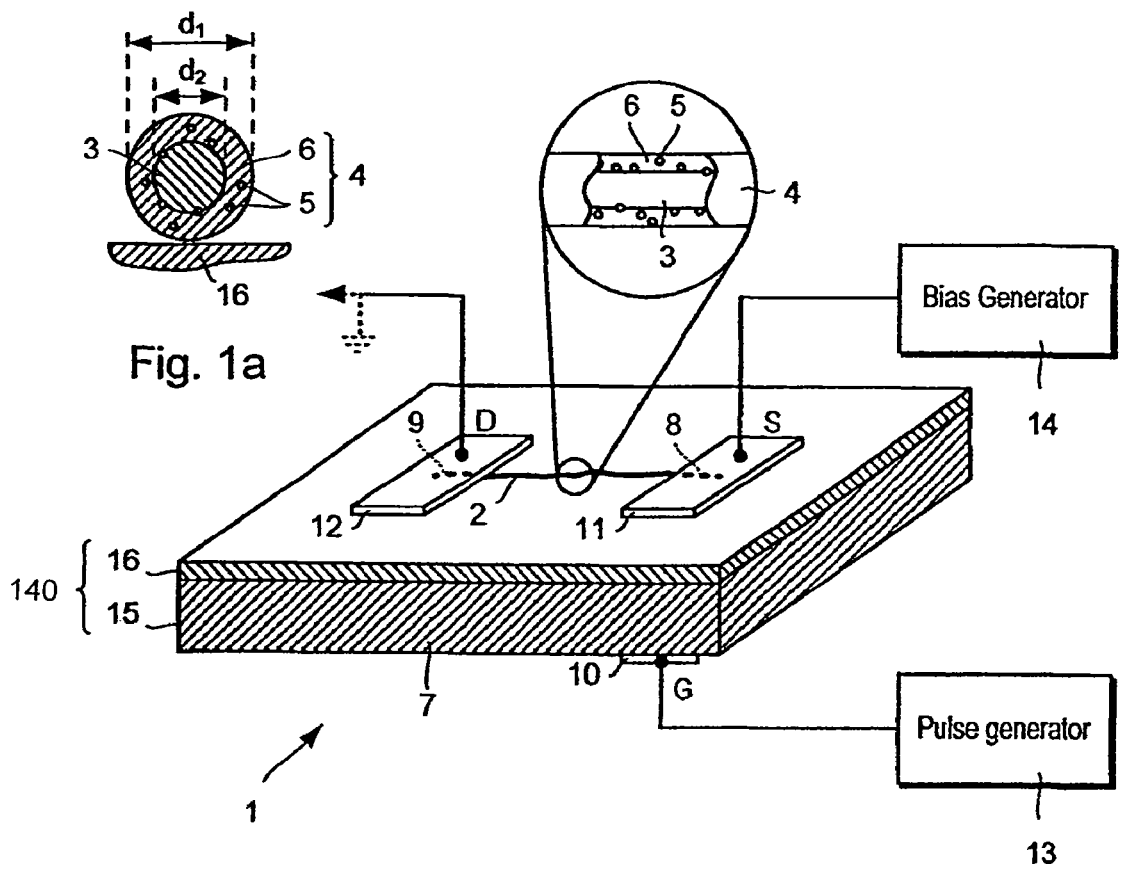
Fig. 1a
Fig. 1
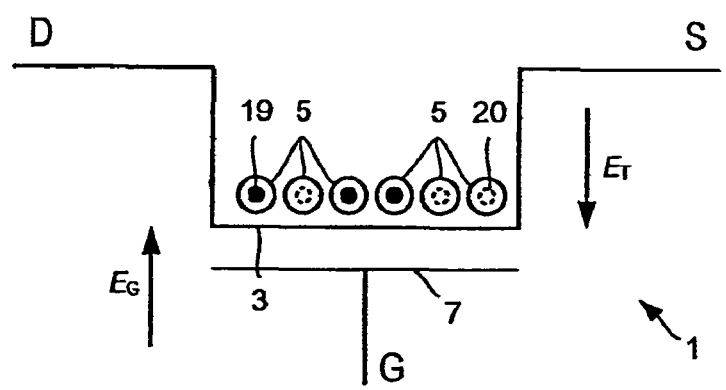
Fig. 3

NANOWIRE

FIELD OF THE INVENTION

The present invention relates to a nanowire.

BACKGROUND

A nanowire can exhibit unusual effects, such as quantised conduction, which are not usually found in bulk wires. These effects may have potential device applications and much attention is being focussed on incorporating nanowires into existing logic and memory circuits.

SUMMARY OF SOME EMBODIMENTS OF THE INVENTION

According to a first aspect of certain embodiments of the present invention there is provided a method comprising applying a first electric field pulse to a nanowire comprising a channel and a charge trapping region configured to control conductivity of the channel, the first electric field pulse having a first polarity and a relatively large magnitude of integral of electric field during the pulse and, thereafter, applying at least one further electric field pulse to the nanowire, each further electric pulse having a second, opposite polarity and each respective further electric field pulse having a relatively small magnitude of integral of electric field during the pulse.

The first electric field pulse may have a relatively large amplitude and each respective further electric field pulse may have a relatively small amplitude. The first electric field pulse may be relatively long and each further electric field pulse may be relatively short.

Applying the first electric field pulse and applying the at least one further electric field pulse may comprise applying at voltage pulses to at least one gate of a field effect transistor having the channel provided by the nanowire. Applying the first electric field pulse comprises applying a voltage pulse to a gate and wherein applying the at least one further electric field pulse may comprise applying at least one voltage pulse to the gate. Applying the first electric field pulse may comprise applying a voltage pulse to a first gate and wherein applying the at least one further electric field pulse may comprise applying at least one voltage pulse to a second, different gate.

The method may comprise, after applying the at least one further electric field pulse, applying a bias to a contact region of the nanowire for driving current through the channel. The method may comprise applying the at least one further electric field pulse within a predetermined time interval after applying the first electric field pulse.

The method may comprise triggering current flow through the channel in response to the at least one further electric field pulse having an accumulated value of magnitude of the integral of electric field pulse in the time domain over the duration of the pulses exceeding a threshold value.

The nanowire may occupy a first conductance state in response to the first electric field pulse. The nanowire may switch from the first conductance state to a second conductance state in response to at least a predetermined number of the at least one further electric field pulse. The nanowire may switch from the first conductance state to a conductance state $S_i$, which is one of a plurality of N conductance states $S_1, \ldots, S_N$, in response to a number i of the at least one further electric field pulse, wherein the conductance of the state $S_i$ is a substantially linear function of the number i for i less than or equal to N. The first conductance state may have a lower conductance than the second conductance state.

According to a second aspect of certain embodiments of the present invention there is provided a nanowire comprising a channel and a charge trapping region configured to control conductivity of the channel, at least one gate configured to apply electric fields to the nanowire and a pulse generator configured to apply voltage pulses to the at least one gate so to apply a first electric field pulse to the nanowire, the first electric field pulse having a first polarity and a relatively large magnitude of integral of electric field during the pulse and, thereafter, to apply at least one further electric field pulse to the nanowire, each further electric pulse having a second, opposite polarity and each respective further electric field pulse having a relatively small magnitude of integral of electric field during the pulse.

The apparatus may comprise a bias generator configured to drive current through the channel after application of the voltage pulses.

The charge trapping region may be disposed at a surface of the nanowire. The charge trapping region may include charge trapping centres. The charge trapping centres may comprise surface states on the surface of the channel. The charge trapping centres may comprise interface states between the channel and an insulating material. The charge trapping centres may include ion impurities in an insulating material. The charge trapping region may include an insulating material.

The channel may comprise a semiconductor material. The semiconductor material may be crystalline. The semiconductor material may comprise silicon.

The charge trapping region may include a compound of the semiconductor material.

The nanowire may have a smallest dimension of less than 1 μm, no more than 100 nm or no more than 10 nm.

The at least one gate may include a back gate, a top gate and/or a side gate. The at least one gate may comprise first and second gates.

The pulse generator may include at least one other nanowire operatively connected to the at least one gate.

The apparatus may further comprise a capacitor configured to drive current through the channel after application of the at least one further electric pulses.

According to a third aspect of certain embodiments of the invention there is provided an apparatus comprising at least two nanowires, each nanowire comprising a channel and a charge-trapping region configured to control conductivity of the channel, at least two gates, each gate configured to an apply electric field to a respective nanowire; and at least one conductive element configured to be switchable between at least two non-volatile conductive states, wherein each conductive element is configured to pass a signal from at least one nanowire to a gate of another nanowire. The signal may be a voltage or current pulse or spike.

The apparatus may further comprise at least one further gate configured to an apply electric field to the at least two nanowires. The apparatus may further comprise at least two capacitors, each capacitor configured to discharge through the channel of a respective nanowire.

According to a fourth aspect of some embodiments of the present invention there is provided a method comprising applying a first voltage pulse of given polarity, to at least one gate of a field-effect transistor comprising a nanowire which includes a channel and a charge trapping region, so as to trap a given amount of charge in the charge trapping region and, thereafter, applying at least one further pulse of opposite polarity, to the at least one gate, so as to release at least some of the trapped charge. The charge may comprise electrons or the charge may comprise holes.

According to a fifth aspect of certain embodiments of the present invention there is provided a method comprising applying a first electric field pulse to a nanowire comprising a channel and a charge trapping region configured to control conductivity of the channel, the first electric field pulse having a first polarity, a duration and a relatively large magnitude of integral of electric field in the time domain over the duration of the pulse and, thereafter, applying at least one further electric field pulse to the nanowire, each further electric pulse having a second, opposite polarity and each further electric field pulse having a respective duration and a respective relatively small magnitude of integral of electric field in the time domain over the pulse.

BRIEF DESCRIPTION OF THE DRAWINGS

Embodiments of the present invention will now be described, by way of example, with reference to the accompanying drawings in which:

FIG. 1 is a perspective view of a transistor which includes a nanowire according to certain embodiments of the present invention;

FIG. 1a is a cross-sectional view of the nanowire shown in FIG. 1;

FIG. 3 is a schematic view of surface traps in the transistor shown in FIG. 1;

DETAILED DESCRIPTION OF CERTAIN EMBODIMENTS

Figure 2A:
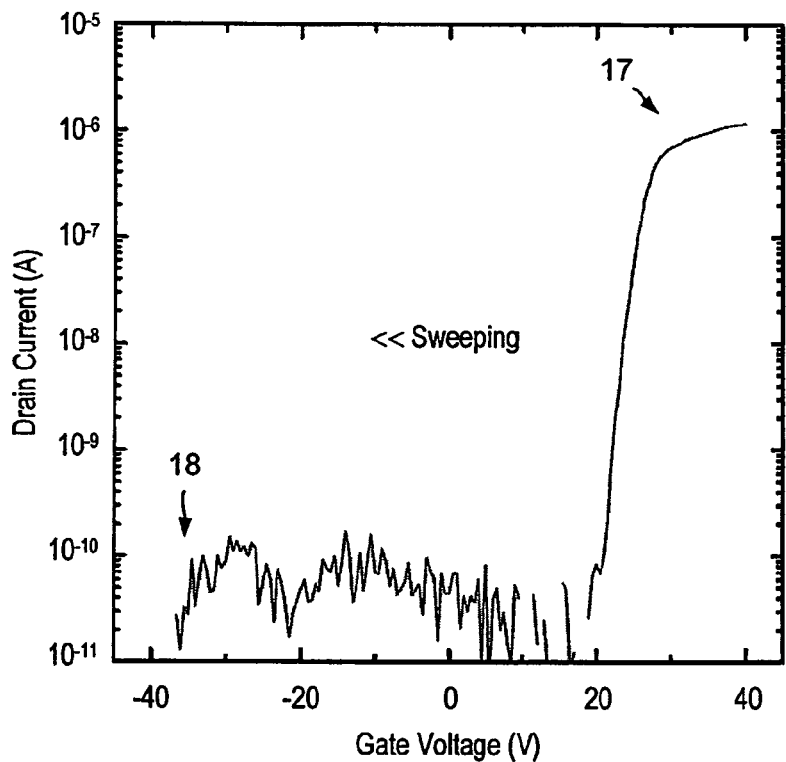
FIG. 2a is a plot of drain current against gate voltage for the transistor shown in FIG. 1 as the gate voltage is swept from positive to negative.

Referring to FIGS. 1 and 1a, a field-effect transistor 1 (hereinafter referred to as a "transistor") in accordance with certain embodiments of the invention is shown. FIG. 1 includes a magnified, cut away view of a part of the transistor 1.

The transistor 1 includes a nanowire 2 having a channel 3 and a charge trapping region 4. The charge trapping region 4 includes charge trapping centres 5 and, optionally, insulating material 6. The transistor 1 also includes a gate 7 and first and second contact regions 8, 9 (hereinafter referred to as "source" and "drain"). The gate 7, source 8 and drain 9 are contacted using respective contact pads or leads 10, 11, 12.

As will be explained in more detail later, the transistor 1 can be used to mimic neuronal behaviour and serve as a building block for a neural network. For example, the transistor 1 can provide threshold emitter functionality. A network of artificial neurons can be constructed, e.g. using self-assembly. Furthermore, the transistor 1 can also be used to mimic functional units in a more generalised machine learning system. For example, the transistor can provide linear emitter functionality.

As shown in FIG. 1, in some embodiments of the present invention, a pulse generator 13 is provided and arranged to apply voltage pulses to the gate 7 for resetting and setting the transistor 1. Another pulse generator 14 (herein referred to as a "bias generator") can also be provided to apply a bias between the source 8 and drain 9 for reading out the transistor 1. Suitable pulse generators are available from Hewlett Packard. However, as will be explained in more detail later, the pulse generator can take the form of another transistor 1 having a nanowire channel 2. Thus, an artificial neural network can be constructed by connecting transistors together. In such an artificial neural network, electrical pulses or spikes are fed from one or more transistors as an input to another transistor.

In this example, the nanowire 2 takes the form of a grown silicon nanowire. The channel 3 comprises n-type, single crystal silicon (Si). The channel 3 may comprise a crystalline or poly-crystalline semiconductor material. For example, the channel 3 may comprise a different elemental semiconductor material, such as germanium. The channel 3 may comprise binary or tertiary semiconductor material, such as gallium arsenide (GaAs) or indium gallium arsenide (InGaAs). The channel 3 is doped with phosphorous (P) to a concentration of about $10^{20}$ cm$^{-3}$. However, other n-type impurities may be used. In some embodiments, the channel 3 may be p-type. The channel 3 may be doped to a higher or lower concentration. In some embodiments, the channel 3 is not doped, but is intrinsic. The channel 3 may have a high mobility, for example of the order of 100 cm$^2$ V$^{-1}$ s$^{-1}$ or greater.

The charge trapping region 4 comprises silicon dioxide (SiO$_2$) having defects and/or impurities, e.g. dopants, which provide trapping centres 5. The charge trapping region 4 may comprise another different insulating material, such as silicon nitride (Si$_3$N$_4$).

The charge trapping region 4 may be formed when a freshly-grown nanowire is exposed to a gaseous atmosphere. For example, silicon dioxide naturally forms on a surface of silicon, when silicon is exposed to oxygen.

The charge trapping region 4 may be formed by coating a conductive nanowire, for example, by sputtering. For example, silicon dioxide or silicon nitride can be used to coat a silicon nanowire or a carbon nanotube. This technique can be used when a nanowire or nanotube does not react to form a compound material at its surface, such as in the case of a carbon nanotube. It can also be used when a nanowire does react to form a layer of compound material at its surface, but the surface layer is too thin and/or does not provide a sufficient concentration of naturally-forming trapping centres. Thus, this technique can be used to form a thicker charge trapping region.

The charge trapping region 4 may be formed by ion implantation, e.g. using argon ions (Ar⁺) or dopant ions. However, the nanowire 2 need not be annealed so as to preserve defects.

The charge trapping region 4 may comprise surface states on the outer surface of a nanowire channel. Thus, the charge trapping region 4 may be a surface and need not include insulating material. For example, the charge trapping region may include dangling bonds on the surface of a nanowire channel without any surface coat, such as a surface oxide.

The charge trapping region 4 may comprise interface states between the outer surface of a nanowire channel and a surface coat, such as a surface oxide. Thus, although an insulating material may be used to form interface states, in some instances, the insulating material need not form part of the charge trapping region. However, in some instances, the insulating material forms part of the charge trapping region, for example, by virtue of electrically active states, such as dopant ions, being embedded within the insulating material.

The nanowire 2 need not be grown, but can be lithographically defined by masking and etching a layer of semiconductor, such as silicon. Thus, charge trapping centres may have higher concentrations on some surfaces, e.g. side walls, than other surfaces, e.g. top surface.

Referring in particular to FIG. 1*a*, the nanowire 2 is substantially circular in cross-section. The channel 3 is substantially circular in cross-section and the charge trapping region is substantially annular in cross section. However, the nanowire 2 may be rectangular in cross section. The nanowire 2 may have a regular or irregular shape in cross section. The nanowire 2 has a diameter, $d_1$, in this case of about 40 nm. The channel 3 has a diameter, $d_2$, in this example of about 20 nm. However, the nanowire 2 may have diameter, width or smallest dimension equal to or less than 1 µm, equal to or less than 100 nm, equal to or less than 10 nm, or equal to or less than 1 nm. In this example, the nanowire 2 has a length of about 10 µm. The nanowire 2 can have a length of the order of 1 µm, 10 µm or greater.

The nanowire 2 is disposed on a substrate 140 which includes a semiconductor bottom layer 15 (herein also referred to as the base) and an insulating top layer 16 having a thickness of about 200 µm. The bottom layer 15 comprises p-type silicon and the top layer 16 comprises silicon dioxide ($SiO_2$). The thickness of the top layer 16 is chosen to electrically isolate the nanowire 2 and the contact pads 11, 12 from other devices and electrical components. Therefore, the top layer 16 may be thicker or thinner. The substrate 140 may have fewer or more layers. For example, the substrate 140 need not include a semiconductor bottom layer. The substrate 140 may comprise a layer of glass. The insulating top layer 16 may comprise another insulating material, such as silicon nitride.

The semiconductor bottom layer 16 is used to provide a back gate 7 for controlling the conductance of the channel 3 by the application of a voltage to the gate 7. Other gate geometries may be used, such as a top gate or a side gate. Moreover, as will be explained in more detail later, more than one gate can be provided. Furthermore, a gate can be provided with one or more inputs, each of which may be weighted, for example by selectively altering a coupling coefficient between the gate and an input.

As explained earlier, the gate 7 is operatively coupled to the pulse generator 13 so as to enable a gate voltage to be applied to the gate 7. This can be used to apply an external electric field to the nanowire 2.

When a voltage pulse is applied to the gate 7, a current pulse flows to the gate 7. Current dependence on voltage tends not to be linear due to the capacitive behaviour of the gate 7. However, far from a saturation regime, it can be assumed that a current flows for a voltage pulse. In this regime, the charge (Q) flowing onto the gate 7 for a voltage pulse can be expressed in terms of current (I) times by the pulse duration (t) and this can be considered to be the additional cumulative charge trapped in the nanowire for a pulse. The field in the channel arising from the trapped charge is proportional to the trapped charge and can be used to control flow in the transistor 1.

The source 8 is operatively coupled to the bias generator 14 so as to enable a bias voltage to be applied which drives a drain current through the channel 3. For example, the gate 7 can be coupled to the pulse generator 13 and the source 8 to the bias generator 14 via metallic bond wires (not shown). The drain 9 may be grounded and the gate voltage and bias voltage may be referenced with respect to ground. Alternatively, the drain may be connected to another device.

Figure 2B:
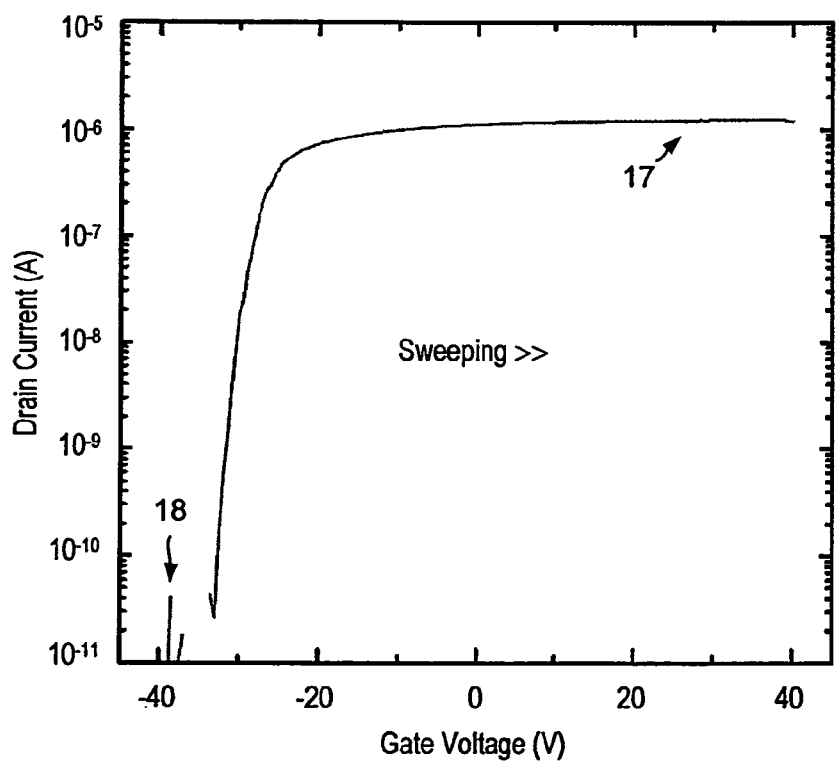
FIG. 2b is a plot of drain current against gate voltage for the transistor shown in FIG. 1 as the gate voltage is swept from negative to positive.

Referring also to FIGS. 2*a* and 2*b*, exemplary plots are shown of the drain current, $I_D$, through the channel 3 as the gate voltage, $V_G$, is swept in different directions whilst keeping the bias voltage substantially constant at room temperature. The measurement can be taken using a parameter analyser which incorporates the pulse generators 13, 14. The drain current varies between a relatively high value, indicative of a relatively high conductance state 17, and a relatively low value, indicative of a relatively low conductance state 18. The relatively high conductance state 17 can be considered as an "ON" state of the transistor 1 and the relatively low conductance state 18 can be considered as an "OFF" state. For a sufficiently large positive gate voltage (in this example, approximately +40 V), the nanowire 2 occupies the relatively high conductance state 17 independent of the history of application of the gate voltage. Similarly, for a sufficiently large negative gate voltage (e.g. −40 V), the nanowire 2 occupies the relatively low conductance state 18. Otherwise, the nanowire 2 switches between the two states 17, 18 at a threshold voltage which varies depending on whether the gate voltage is swept from positive to negative voltages or from negative to positive voltages. In this example, the threshold voltage is approximately +25 V for sweeps from positive to negative voltages (FIG. 2*a*) and approximately −30 V for sweeps from negative to positive voltages (FIG. 2*b*). Thus, drain current as a function of gate voltage follows a hysteresis loop. In other embodiments, the threshold voltages may be higher or lower.

Because the transistor 1 has an n-type channel, it has a relatively high conductance state 17 for positive gate voltages and a relatively low conductance state 18 for negative gate voltages. However, in other embodiments in which the transistor 1 has a p-type nanowire channel, the transistor has a relatively low conductance state for positive gate voltages and a relatively high conductance state for negative gate voltages. Thus, a p-type channel transistor has a relatively high conductance (ON) state for negative gate voltages.

The hysteric response of the transistor 1 arises as a result of charge trapping at or near to the surface of the channel 3.

Referring to FIGS. 2*a*, 2*b* and 3, a positive applied gate voltage increases the population of electrons in the nanowire 2. Some electrons 19 are trapped in surface states 5 (or "traps") with a different binding energy at or near to the surface of the nanowire channel 3. At a sufficiently large positive voltage, a given number (e.g. all) of the traps 5 are populated with trapped electrons 19. Some of these electrons 19 remain trapped as the positive gate voltage is decreased and produce an electric field ($E_T$) which tends to screen the channel 3 from the gate field ($E_G$), thus reducing the population of electrons in the channel 3 and causing the nanowire 2 to switch to the relatively low conduction state sooner than it would in the absence of the trapped charges. Then, as the gate voltage is reduced to zero, some electrons may still remain trapped.

Applying a negative gate voltage tends to deplete the traps 5 of electrons and repopulate the traps 5 with holes 20. At a sufficiently large negative gate voltage, a given number (e.g. all) of the traps 5 are populated with trapped holes 20. Some of these holes remain trapped as the negative gate voltage is decreased, producing an electric field which tends to screen the channel 3 from the gate field, thus increasing the population of electrons in the channel 3 and causing the nanowire 2 to switch to the relatively high conduction state sooner than it would in the absence of the trapped charges (see FIG. 2b). As the gate voltage is again reduced to zero, some holes may still remain trapped.

These charge trapping effects are relatively large (compared to surfaces of bulk material) because of the large surface-to-volume ratio of the nanowire 2. Such large effects generally occur when the diameter or width and/or height of the nanowire 2 is less than about 100 nm. Alternatively, the nanowire 2 may have a larger cross section but be configured, for example with a larger number of surface traps 5, for example having a higher concentration of traps 5 by using a higher dose ion implantation, and/or with more efficient surface traps 13, so that it exhibits the hysteric behaviour described above.

If a positive gate voltage pulse is applied which has a sufficiently large amplitude and is sufficiently long to prepare the transistor 1 with negative traps 5 fully charged, the traps 5 remain populated and the transistor occupies an OFF state when the gate voltage is removed. Alternatively, if a negative gate voltage pulse is applied which has a sufficiently large amplitude and is sufficiently long to prepare the transistor 1 with positive traps 5 fully charged, the traps 5 remain populated and the transistor occupies an ON state when the gate voltage is removed. Therefore, the transistor 1 exhibits a memory effect.

In order to invert the trap population, i.e. deplete the traps 5 of electrons 19 and repopulate the traps 5 with holes 20, a voltage pulse of opposite polarity is applied to the gate 7 for a sufficiently long time and/or of a sufficiently large amplitude. In contrast, a smaller and/or shorter pulse of opposite polarity may only partially invert the trap population and the threshold voltage may be only partially shifted, for example, to an intermediate voltage between the two threshold voltages illustrated in FIGS. 2a and 2b.

Figure 4:
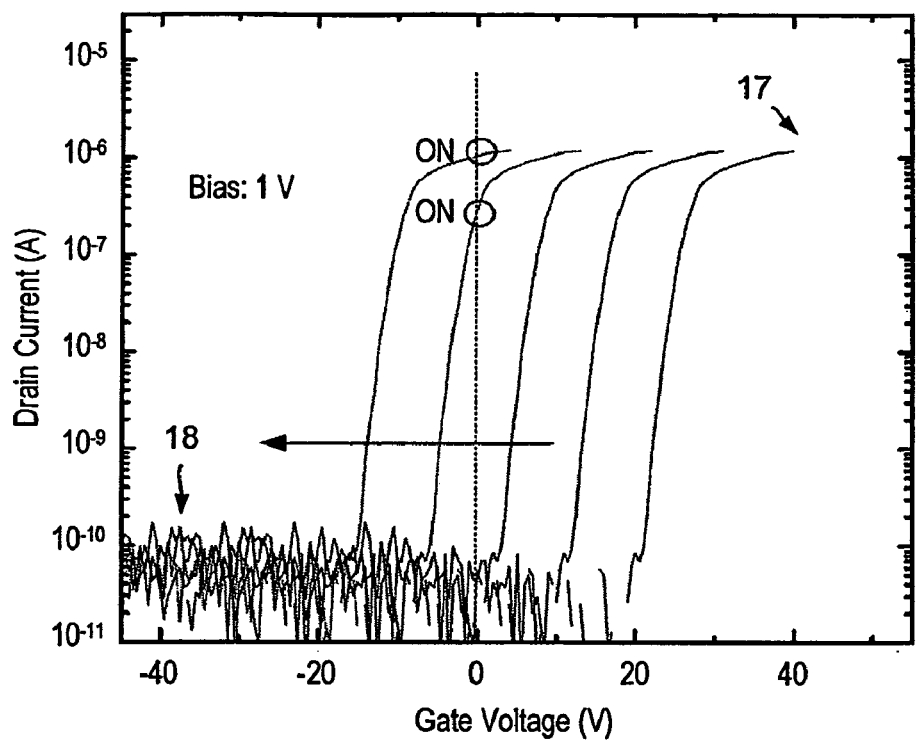
FIG. 4 is a plot of drain current against gate voltage for the transistor shown in FIG. 1 as a series of negative gate voltage pulses are applied.

For example, referring to FIG. 4, if the transistor 1 has been prepared so that it is OFF at zero gate voltage by applying a relatively large amplitude and/or relatively long positive voltage pulse to the gate 7, and, thereafter, a relatively small amplitude and/or relatively short negative voltage pulse is applied, then the threshold voltage may be shifted leftwards by a certain amount. Then, applying a second relatively small amplitude and/or relatively short negative voltage pulse may shift the threshold voltage leftwards again. More negative voltage pulses may progressively shift the threshold voltage leftwards. For a fixed pulse amplitude and duration, the number of negative voltage pulses applied to the gate 7 determines the total shift of the threshold voltage. If a sufficient number of negative voltage pulses are applied, then the threshold voltage may become negative, such that the transistor 1 is ON at zero gate voltage. After this, applying more negative voltage pulses does not change the state of the transistor 1 at zero gate voltage. However, applying another relatively large amplitude and/or relatively long positive voltage pulse "resets" the transistor 1 to an OFF state at zero gate voltage. Alternatively, the transistor 1 may be prepared in an ON state by a negative voltage pulse and then switched OFF by a sufficient number of positive voltage pulses.

In this example, the reset pulse is about 40V and has a duration of about 1 second. The set pulses are about −40V and have a duration of about 10 milliseconds. In this example, the traps retain charge (i.e. have a relaxation time) of the order of hours. The bias and the pulse time varies with device geometry, e.g. how close the gate is to the nanowire, and the materials, e.g. defect concentration.

Figure 5:
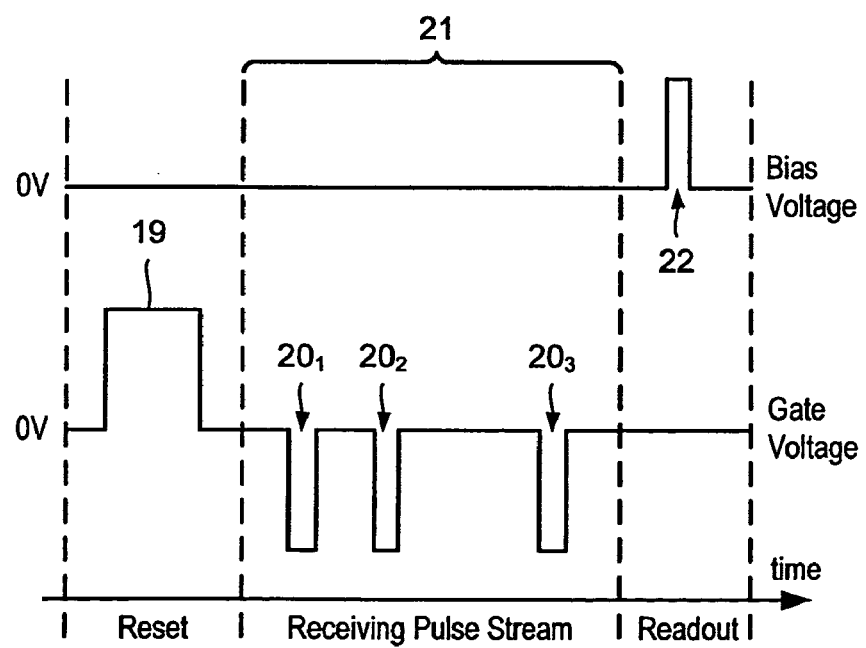
FIG. 5 shows an example of voltage pulses applied to the transistor shown in FIG. 1.
Figure 6:
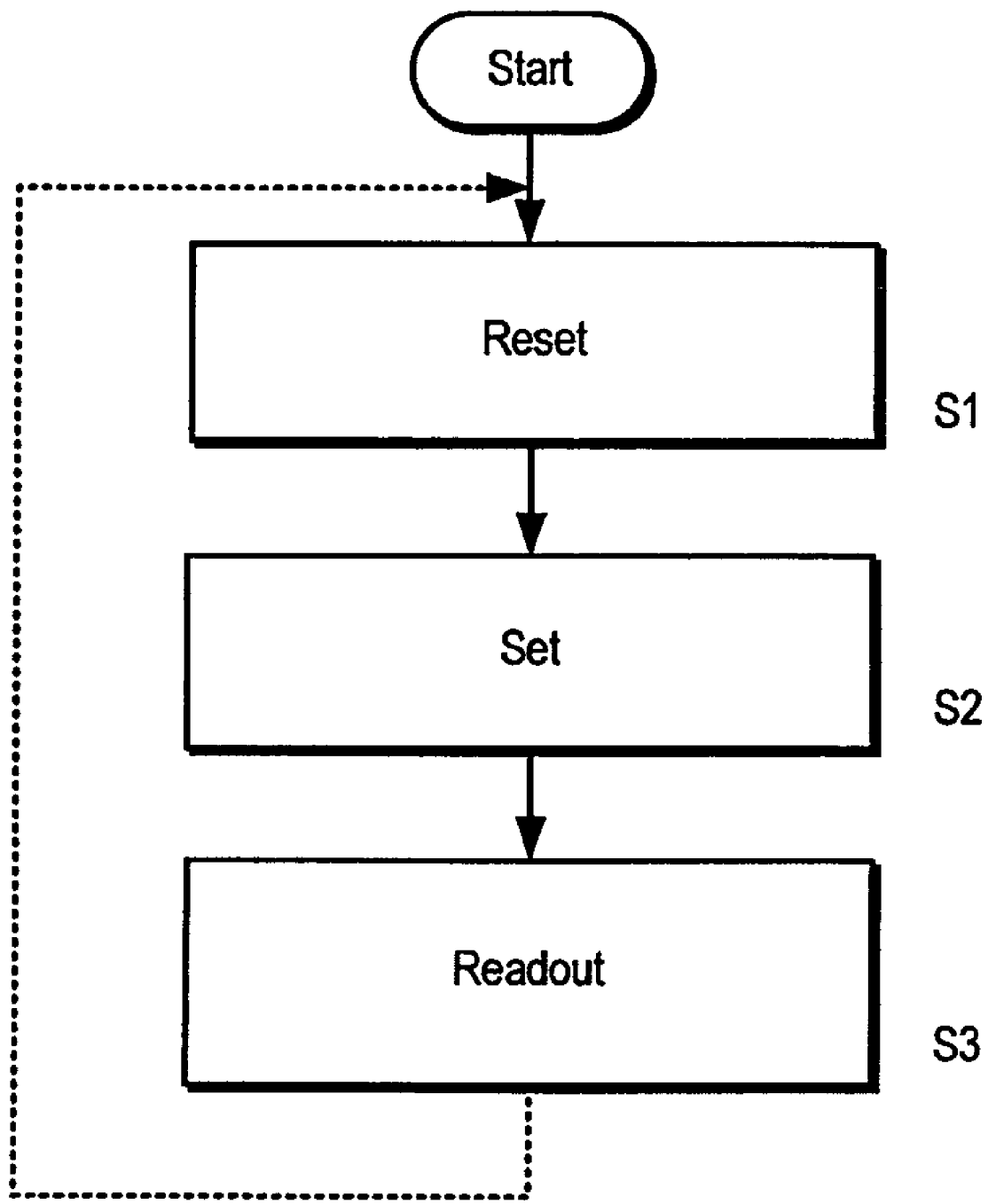
FIG. 6 is a flow diagram showing a method of applying voltage pulses to the transistor shown in FIG. 1.

Referring to FIGS. 5 and 6, an example of a method of operating the transistor 1 is shown.

A relatively long positive voltage pulse 19 is applied to the gate 7 in order to reset the transistor 1 to the OFF state (step S1). The pulse 19 has a relatively high value of voltage-second and/or produces an electric field in the region of the nanowire 2 which has a relatively high value of integral of electric field in the time domain over the duration of the pulse. Thereafter, at least one relatively short negative voltage pulse $20_1, 20_2, 20_3$ is applied to the gate 7 (step S2). Each pulse $20_1, 20_2, 20_3$ has a relatively low value of voltage-second and/or produces an electric field in the region of the nanowire 2 which has a relatively low value of integral of electric field in the time domain over the duration of the pulse. In this example, three input pulses $20_1, 20_2, 20_3$ are applied within a predetermined time interval 21 ("collection window") after the reset pulse 19. Alternatively or additionally, the positive voltage pulse 19 may have a relatively large amplitude compared to the at least one negative voltage pulses $20_1, 20_2, 20_3$. After a predetermined time interval 21 has elapsed, the state of the transistor 1 may be determined by applying a bias voltage pulse 22 to the source 8 (step S3).

If not enough pulses $20_1, 20_2, 20_3$ have been applied within the collection window 21 to shift the curve such that the threshold voltage is negative, then no current will flow to the drain 9. In contrast, if enough pulses $20_1, 20_2, 20_3$ have been applied to switch the transistor 1 ON, the bias voltage pulse will propagate through the channel 3 and will appear at the drain 9. Alternatively, the pulse 19 may be negative so that the transistor 1 is initially switched ON and the at least one pulse $20_1, 20_2, 20_3$ may be positive so that the transistor 1 is switched OFF if enough pulses are received.

The voltage pulse appearing at the drain 9 may be "read" using an appropriate device. The voltage pulse appearing at the drain 9 may also be inputted into another, similar transistor connected to the transistor 1. For example, the drain 9 may be operatively coupled to a gate of another, similar transistor.

The threshold number of input pulses required to switch the transistor from the OFF state to the ON state or vice versa depends on the intrinsic hysteric behaviour of the transistor 1 (which is generally fixed for a particular transistor 1) and also depends on the amplitude and duration of the input pulses $20_1, 20_2, 20_3$ (which may be readily adjusted). For example, by reducing the duration of the input pulses $20_1, 20_2, 20_3$, the threshold number will be increased.

Figure 7:
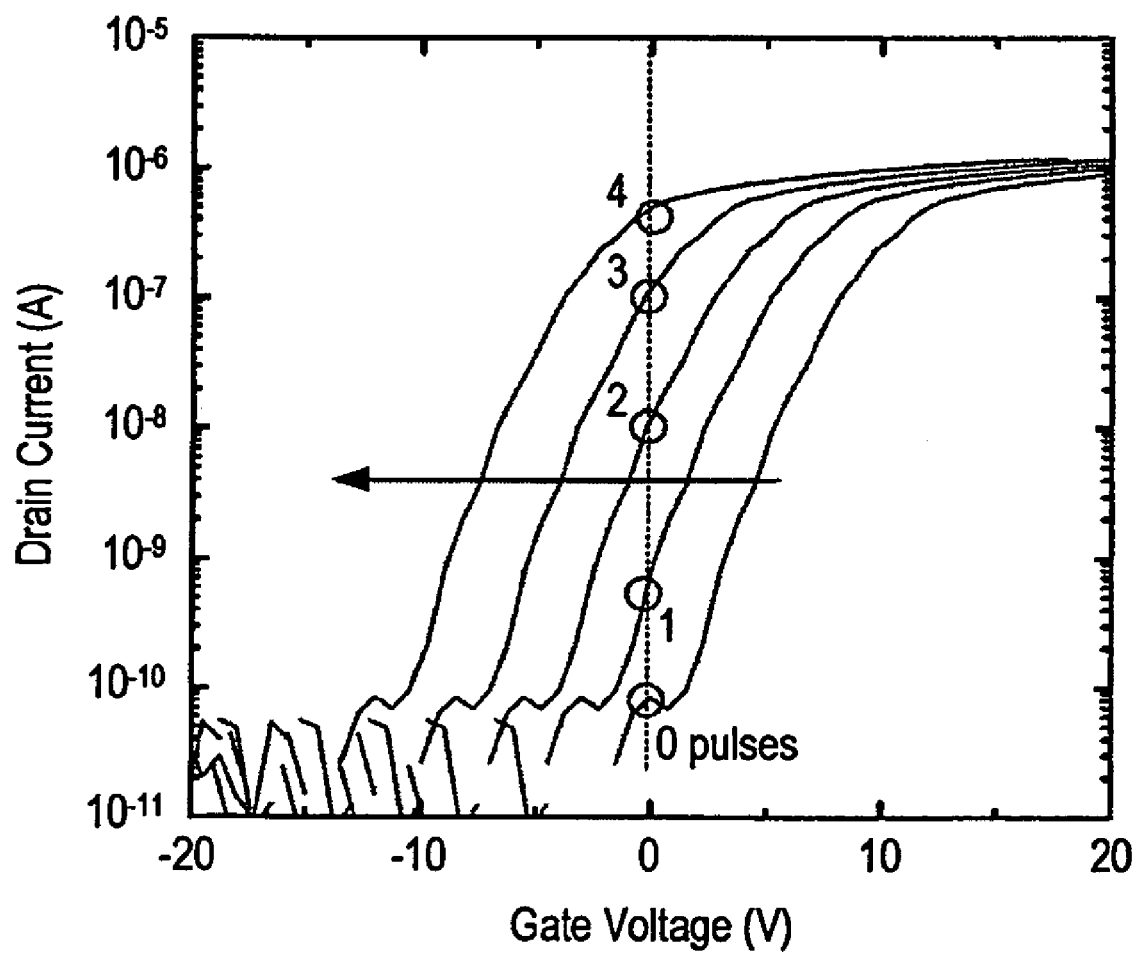
FIG. 7 is a plot of drain current against gate voltage for the transistor shown in FIG. 1 as a series of negative gate voltage pulses are applied.

Referring to FIG. 7, an exemplary plot is shown of the response of a transistor 1 which, instead of being switchable e.g. from OFF to ON by a single relatively small amplitude and/or relatively short negative voltage pulse, is incrementally switchable, i.e. in a step-by-step manner.

The transistor 1 is initially in the OFF state as the drain current (for a constant bias voltage) at zero gate voltage is a relatively low value. However, the drain current at zero gate voltage progressively increases with each negative voltage pulse which is applied to the gate 7, until, after four pulses, the transistor has reached its ON state and the drain current at zero gate voltage has reached a maximum value.

Figure 8:
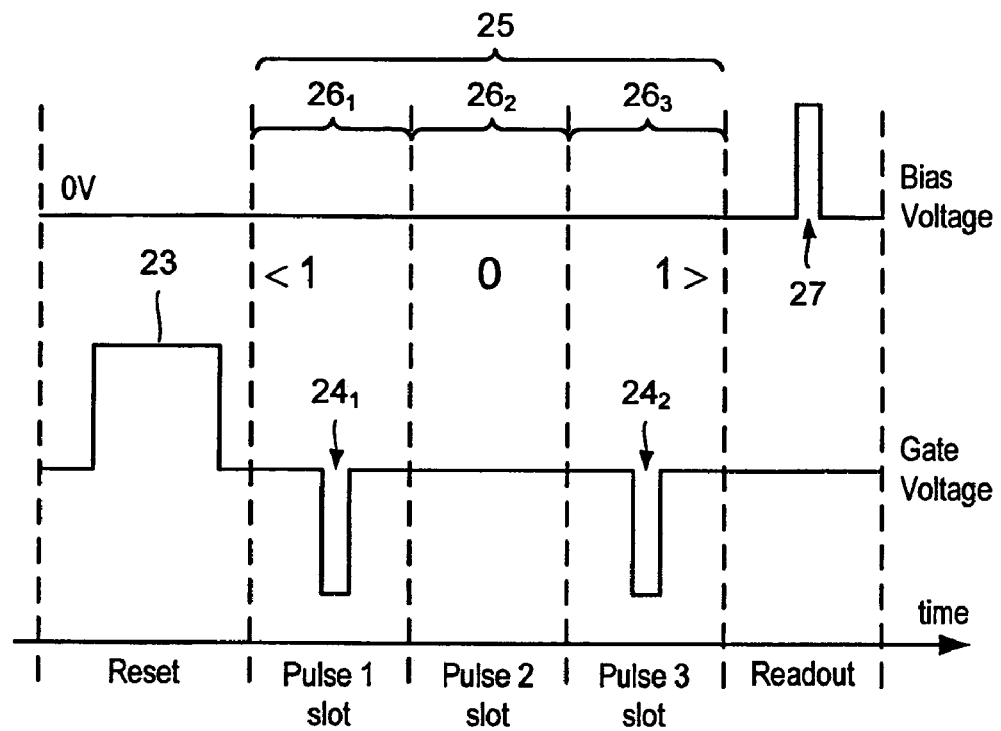
FIG. 8 shows another example of voltage pulses applied to the transistor shown in FIG. 1.

In order to be able to control more precisely the incremental response of the transistor 1, the transistor 1 may be configured to have a broader sub-threshold slope, i.e. drain current versus gate voltage having a lower gradient in the region between the high and low conductance states, and/or to have a longer charging time for traps. This can be achieved, for example by using low-mobility materials for the channel 3 and/or creating more traps 5 in order to increase the hysteresis. Referring to FIG. 8, an example of another method of operating the device is shown.

The transistor 1 is prepared so that it is just OFF at zero gate voltage by applying a suitable relatively large amplitude and/or relatively long positive voltage pulse 23 to the gate 7. Then, at least one relatively small amplitude and/or relatively short negative voltage pulse $24_1$, $24_2$ is applied. The negative voltage pulses $24_1$, $24_2$ may be applied within a predetermined time interval 25. Furthermore, the predetermined time interval may be subdivided into a plurality of time slots $26_1$, $26_2$, $26_3$, where a maximum of one negative voltage pulse $24_1$, $24_2$ may be applied during each time slot $26_1$, $26_2$, $26_3$. In this example, the time interval 25 is divided into three time slots $26_1$, $26_2$, $26_3$, and two negative voltage pulses $24_1$, $24_2$ are applied, although any number of time slots may be used and any number of negative voltage pulses $24_1$, $24_2$ may be applied up to a maximum of one pulse per time slot. Alternatively, the transistor 1 may be prepared in an ON state by applying a positive gate voltage pulse and then at least one positive voltage pulse may be applied. After the time interval 25, a bias voltage pulse 27 may be applied to the source 8.

Figure 9:
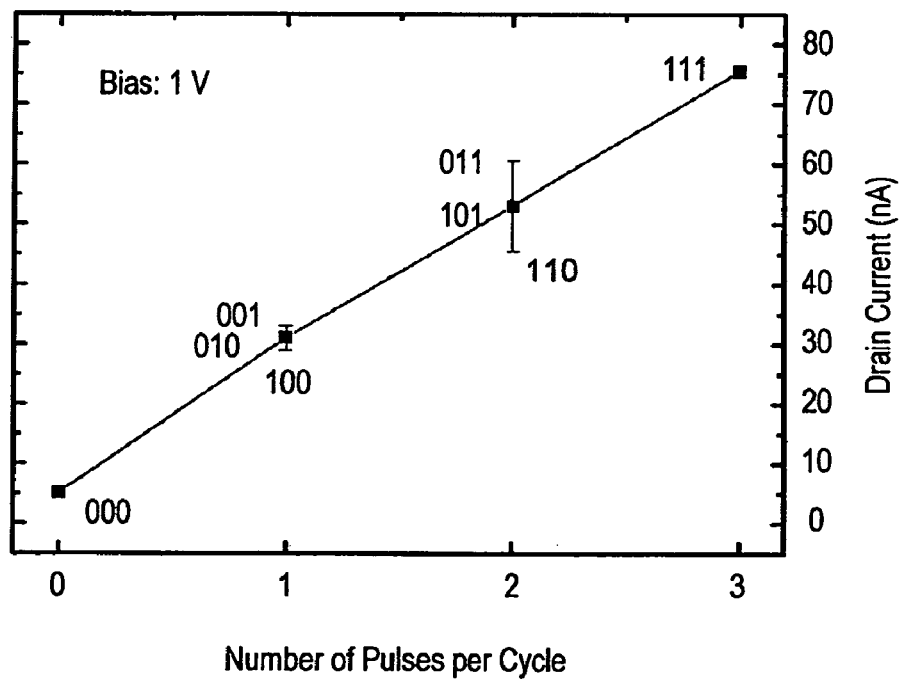
FIG. 9 is a plot of drain current against number of gate voltage pulses for the transistor shown in FIG. 1, also showing the order in which gate voltage pulses are applied.

Referring to FIG. 9, the drain current which flows in response to the bias voltage pulse $24_1$, $24_2$ is substantially proportional to the number of pulses applied during the time interval 25. In particular, the drain current is substantially independent of the particular order or slot configuration in which the gate voltage pulses were applied. Thus, the transistor 1 can perform analogue integration functions.

The transistor 1 (FIG. 1) can be used to mimic operation of a neuron, as will now be described.

Figure 10:
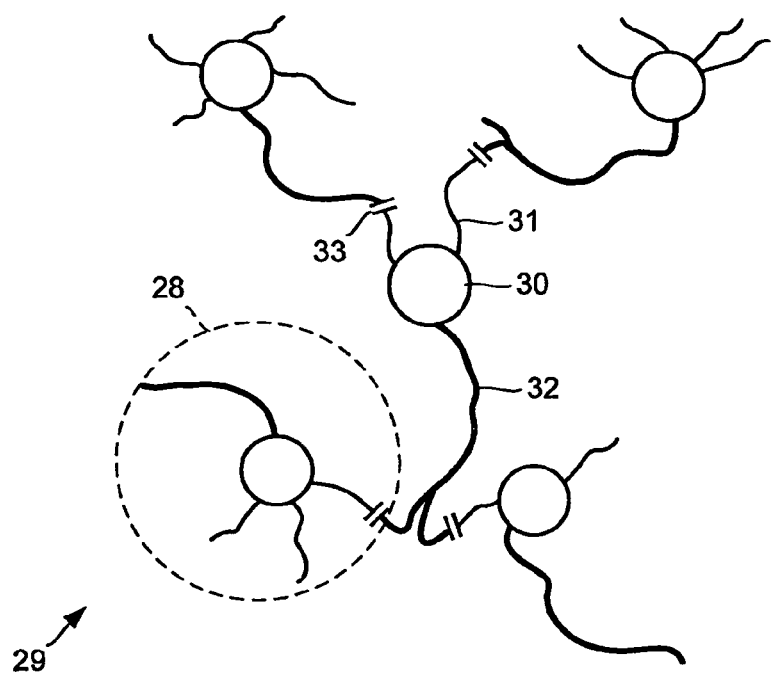
FIG. 10 is a schematic diagram of a biological neural network.

Referring to FIG. 10, a neuron 28, which is the basic building block of a neural network 29, generally comprises a cell body 30, dendrites 31 and an axon 32 connected to the cell body 30. An axon 32 of a neuron 28 may be coupled to a dendrite 31 of another neuron (or to a plurality of other neurons) via a synapse 33. Dendrites 31 act as inputs to the neuron and axons 32 act as outputs.

Figure 11:
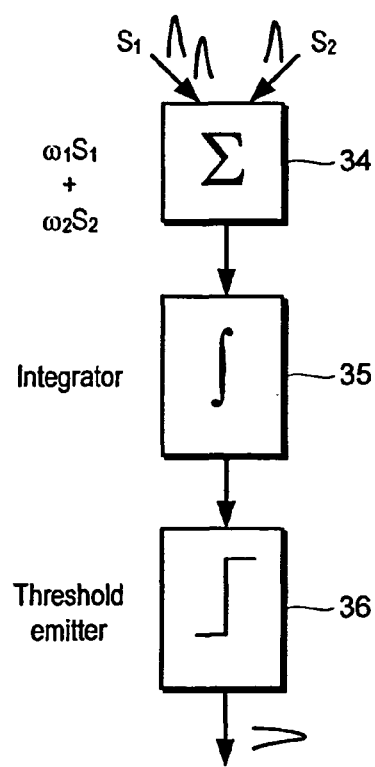
FIG. 11 is a functional block diagram of a model of a neuron.

Referring also to FIG. 11, the neuron 28 can be represented by a series of functional blocks 34, 35, 36.

The neuron 28 receives one or more input signals ($S_1$, $S_2$) in the form of electrical or chemical "spikes".

A first block 34 corresponds to the function of the synapses 33, each of which act as an input filter, i.e. a tunable weight whose "importance" ($\omega_1$, $\omega_2$) is set and varied following a learning process. Therefore, the memory of the network resides in the synapses 33 and a correct neural architecture is programmed through the synapses 33.

As will be explained later, such memory can be provided by a phase changing nanowire, e.g. formed of geranium telluride (GeTe), which connects transistors together. The coupling can be varied, in other words the weight set, by semi-permanently changing the phase of the nanowire by passing a current having a current density above a critical current density for changing the phase of the nanowire.

A second functional block 35 corresponds to one of the functions of cell body 30, namely that of integrator (or "counter"). In particular, electrical pulses converging on the cell body 30 from the one or more inputs are integrated, i.e. counted, according to their synaptic weight.

A third functional block 36 corresponds to another of the functions of cell body 30, namely that of emitter threshold. If, within a given time interval, the number of incoming pulses exceeds a certain threshold, the third functional block 36 delivers an output and resets the counter 35 with a characteristic relaxation time. The input and output spikes are of the same form to allow proper communication between interconnected cells.

A neural network can be considered to be one of a number of different specific machine learning architectures. However, the transistor 1 (FIG. 1) can be used in a more generalised machine learning network, as will now be described.

In machine learning, programming occurs via supervised or unsupervised examples. A neural network can be considered as particular example of machine learning.

Figure 12:
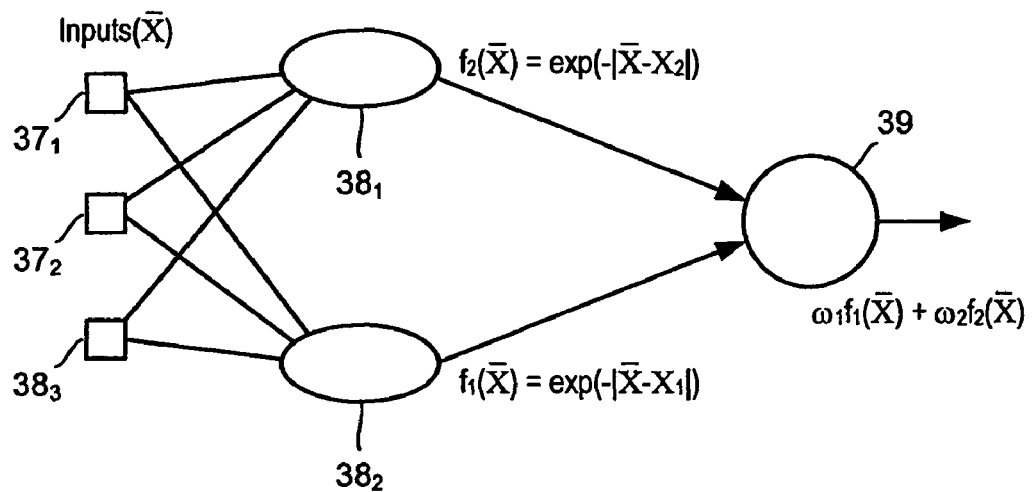
FIG. 12 illustrates a machine learning architecture.
Figure 13:
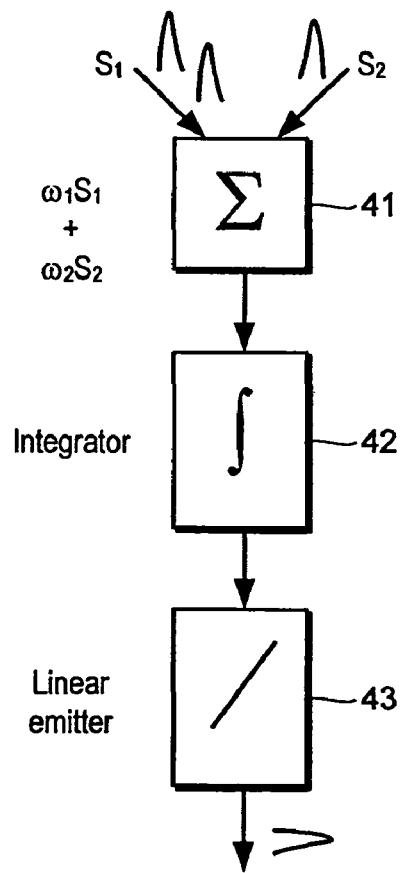
FIG. 13 is a functional block diagram of a model of an artificial neuron for implementing a processing unit for use in machine learning.

Referring to FIGS. 12 and 13, a simplified example of a machine learning architecture is shown.

A plurality of inputs (e.g., sensor responses) $\overline{X}$ are received at blocks $37_1$, $37_2$, $37_3$ and processed in parallel through mathematical filters $38_1$, $38_2$ designed to compare an input with a pre-stored pattern through, for example, an exponential deviation function.

An output is produced by a cascaded mixer unit 39 having the functionality of a linear emitter. A linear emitter is similar to a threshold emitter except that it produces a linear, continuous response rather than a threshold spike. Therefore, a device capable of simulating a biological neuron may also be used in more general machine learning system where information is encoded in pulse streams or frequencies.

Therefore, the transistor 1 can be used to mimic the behaviour of a neuron and other similar processing units by combining the integrator 35, 42 and linear emitter 36 or threshold emitter 43 functional elements.

Referring to FIGS. 14a to 14i, a method of fabricating the transistor 1 (FIG. 1) will now be described.

Figure 14:
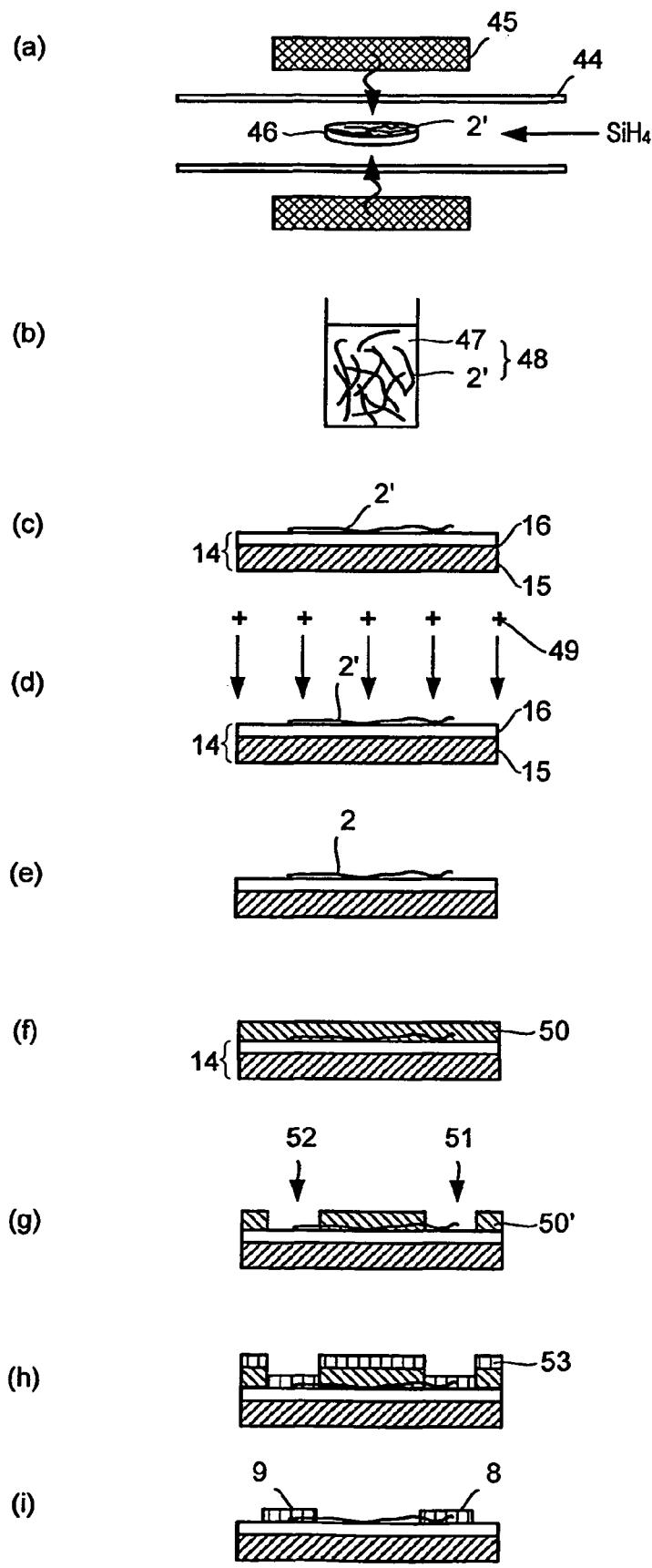
FIGS. 14a to 14i illustrates steps during fabrication of the transistor shown in FIG. 1.

As shown in FIG. 14a, silicon nanowires 2' may be grown by chemical vapour deposition (CVD) in a reactor chamber 44 heated using heating elements 45 to about 300° C. using silane ($SiH_4$) at pressures between 1 and 10 Torr.

Nanowires 2' are grown on a gold thin film 46. At elevated reactor temperatures, the gold film 50 dewets and forms an array of quasispherical nanoparticles about 10 to 30 nm in diameter which act as catalysts for the growth of silicon nanowires.

Other methods can be used to grow silicon nanowires. For example, silicon nanowires may be grown using plasma-assisted chemical vapour deposition (PECVD). Silane may be diluted with helium or hydrogen. Silicon nanowires may be grown on a gold-coated silicon substrate in a vapour-transport reactor by thermally evaporating solid state silicon in an inert argon atmosphere with a powder temperature typically between 1100 and 1300° C. and a substrate temperature typically between 750 and 900° C.

As shown in FIGS. 14b and 14c, the silicon nanowires 2' are dispersed in an organic solvent 47, such as isopropyl alcohol, to form a suspension 48.

The silicon nanowires 2' are applied to the substrate 140, for example, by ink-jet printing the suspension 48 onto the substrate 140. Other methods may be used to apply and align the silicon nanowires 2' such as spin casting, dielectophoresis, Langmuir-Blodgett process, contact printing and sliding. The substrate 140 comprises a degenerately doped p-type silicon wafer 15 on which is grown by thermal oxidation a layer 16 of silicon dioxide 9 having a thickness of 200 nm.

Referring to FIG. 14*d*, phosphorous ions 49 are implanted into the silicon nanowires 2' and the surface of the substrate 140. The phosphorous ions 49 are implanted at an energy of the order of 1 keV and a dose of about $1\times10^{15}$ cm$^{-2}$. If p-type silicon is required, then boron ions may be used.

Referring to FIG. 14*e*, implantation yields nanowires 2 having a higher concentration of defects than the as-grown nanowires 2' (FIG. 14*d*). The sample is not annealed so as to maintain the defects.

The source and drain contact pads 11, 12 (FIG. 1) are defined using a lift-off process.

Referring to FIGS. 14*f* and 14*g*, a resist 50 is applied to the substrate 140, patterned by a scanning electron beam (not shown) and developed to leave a patterned resist 50' defining areas 51, 52 for the contact pads 11, 12 (FIG. 1). A short (e.g. 5 s) etch using buffered hydrofluoric acid is used to remove a surface oxide on the nanowire 2.

Referring to FIG. 14*h*, a bi-layer 53 comprising a base layer of titanium having a thickness of 20 nm and a top layer of gold having a thickness of 90 nm is deposited by electron-beam evaporation.

The resulting device is shown in FIG. 14*i*. Suitable contacts can be made to the source and drain pads 11, 12 using bond wires (not shown). A back chip contact pad 10 (FIG. 1) can be formed by evaporation through a shadow mask.

As mentioned briefly earlier, the transistor 1 (FIG. 1) can be modified to provide synaptic behaviour, as will now be described in more detail.

Figure 15:
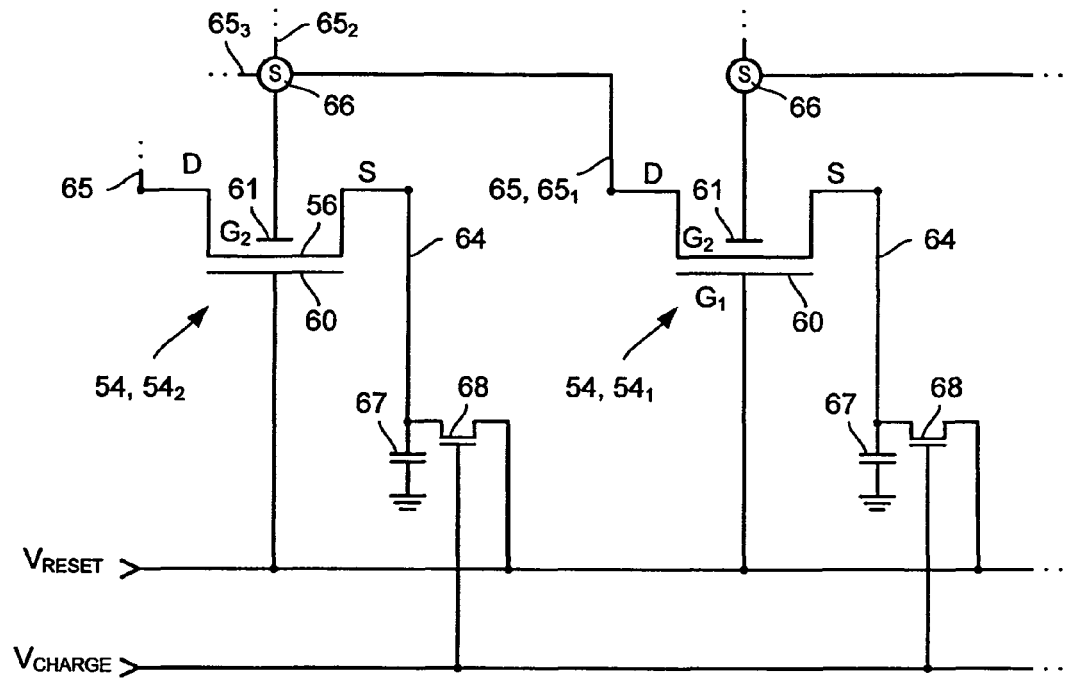
FIG. 15 illustrates a circuit including a transistor according to some embodiments of the present invention.
Figure 16:
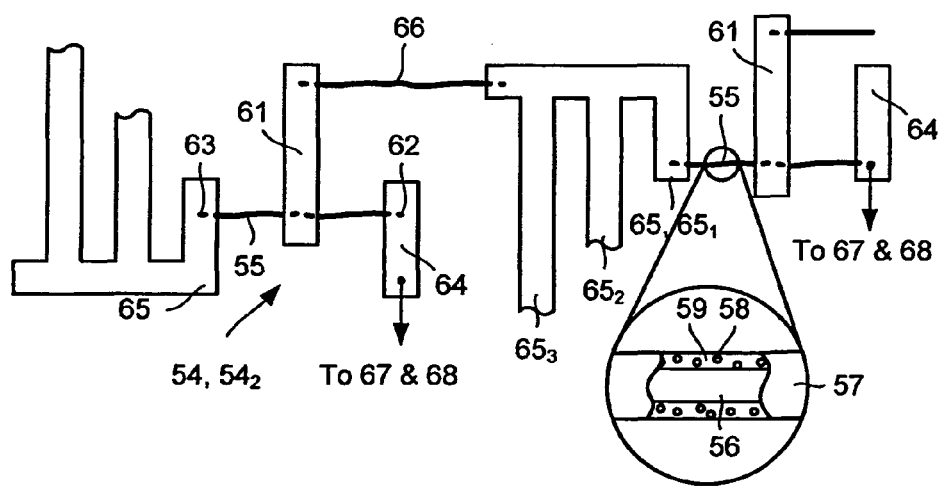
FIG. 16 is a plan view device for implementing the circuit shown in FIG. 15.

Referring to FIGS. 15 and 16, a circuit including first and second field-effect transistors 54 in accordance with some embodiments of the invention is shown. The transistors 54 each have a nanowire 55 having a channel 56 and a charge trapping region 57 which includes charge trapping centres 58 and insulating material 59.

The nanowires 55 are substantially the same and are fabricated in substantially the same way as the nanowire 2 (FIG. 1) described earlier and so will not be described again in detail here. However, as explained earlier, the nanowires 55 may comprise different materials (e.g. GaAs channel), may have different configurations (e.g. be formed by etching) and/or may have different dimensions (e.g. have a diameter or width less than 40 nm).

The transistors 54 share a common first gate 60 and have respective second gates 61.

The common gate 60 is provided by a semiconductor base layer, e.g. p-type silicon substrate, in the same way as the gate 7 (FIG. 1) described earlier and so will not be described again in detail here. However, separate gates may be provided using a top-gate or side-gate configuration. Furthermore, the gate(s) may be formed from other material, such as doped silicon.

Each second gate 61 is provided by a titanium-gold bi-layer. As shown in FIG. 16, the second gates 61 run over the top of the nanowires 55. If the gate is broken as it runs over a nanowire, then it can still form a side gate. If an unbroken track is required, then a thicker bi-layer may be deposited and/or deposited at multiple angles of evaporation.

The transistors 54 include first and second contact regions 62, 63 ("source" and "drain") contacted by respective terminals 64, 65.

As shown in FIG. 15, the drain terminal 65 of a first transistor 541 is connected to the second gate 61 of the second transistor 54, via a synapse 66.

The synapse 66 includes by a memory element 67 which can provide a variable degree of coupling between transistors 54. For example, if the synapse 66 receives several pulses or spikes simultaneously from a predetermined number of transistors 54 via lines 64$_1$, 64$_2$, 64$_3$, then this can be use to switch the element 67 from a relatively high resistance state to relatively low resistance state.

Referring in particular to FIG. 16, the memory element 67 is provided a phase-change nanowire, for example comprising GeTe, Sb$_2$Te$_3$ or Ge$_2$Sb$_2$Te$_5$. However, other forms of memory element can be used such as ionic junctions formed by silver/amorphous silicon/crystalline silicon (Ag/a-Si/c-Si).

In this example, a relatively simple arrangement is used to mimic the behaviour in which a neuron receives multiple inputs via a single synapse. However, in other embodiments, a more complex arrangement can be used in which a neuron receives multiple inputs, each input weighted via its own synapse. This can be implemented by providing each line 64$_1$, 64$_2$, 64$_3$ with its own memory element, e.g. phase-change nanowires, which may or may not feed into another memory element.

Referring again to FIG. 15, each transistor 54 is provided with a supply capacitor 67 connected between the source 64 and ground. The supply capacitor 67 is pre-charged during a reset step via a normally-off field effect transistor 68 ready to discharge and output a signal. The capacitor 67 and transistor 68 can be formed using standard fabrication techniques.

The supply capacitor 67 allows a transistor 54, for example, operating as a threshold emitter, to fire when a threshold number of pulses are received in a collection window and the transistor 54 is switched ON. The transistor 54 remains inactive until the next reset cycle.

Figure 17:
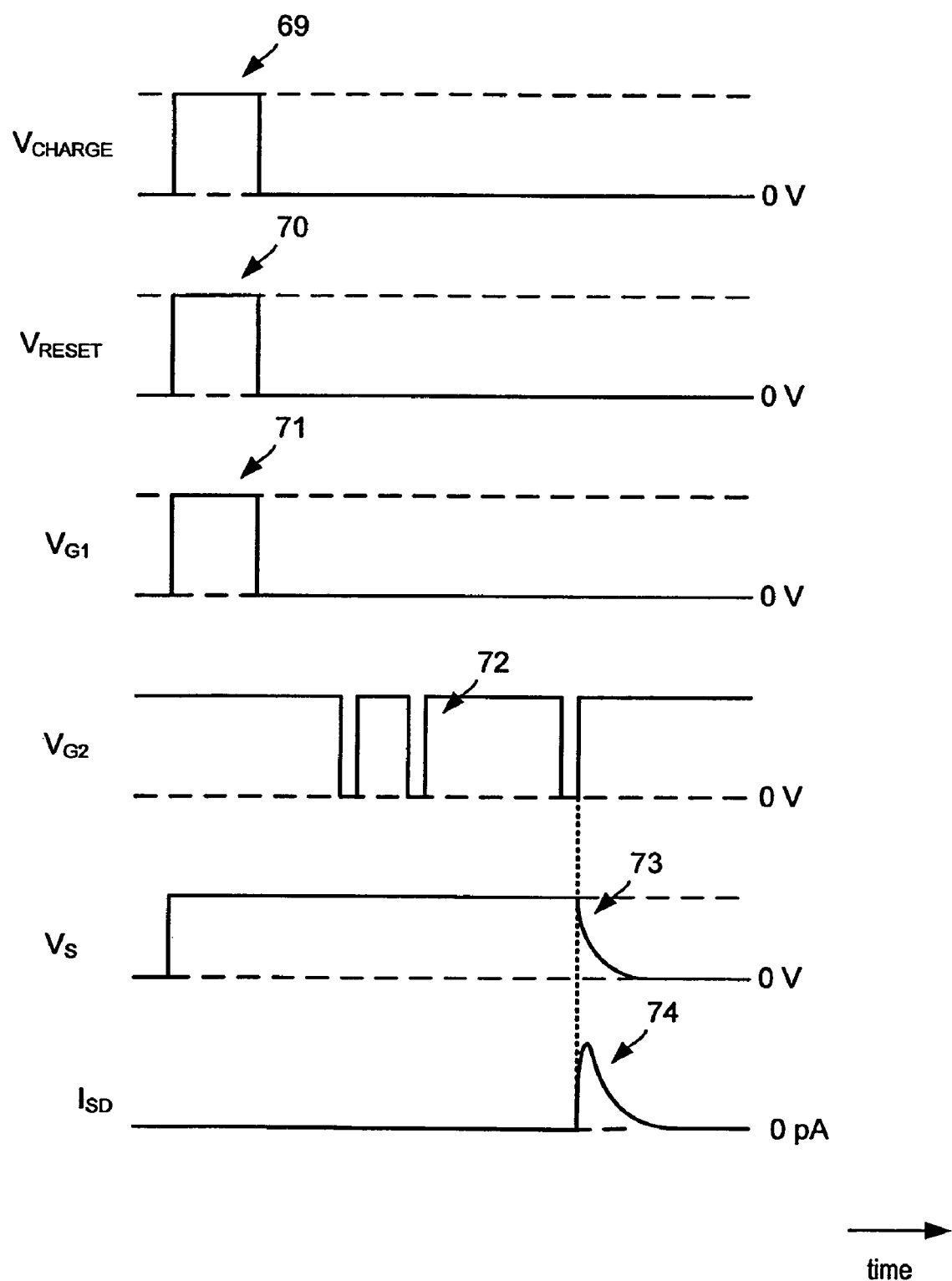
FIG. 17 illustrates plots of voltages and current during operation of the circuit shown in FIG. 15.

Referring also to FIG. 17, a timing diagram shows how a charging pulse 69 and a reset pulse 70 are used to prepare simultaneously the transistors 54 for operation.

Applying the reset pulse 70 also has the effect of applying a bias 71 to the common gate 60 and, thus, applies an electric field to the nanowire 55. This not only fills the trapping centres 59 with electrons, but also depletes the channel 56. Thus, the charging pulse 69 does not cause current to flow in the channel 56.

The second gate 61 applies pulses 72 received from one or more transistors 54. Once a predetermined number of pulses are received, then the channel 56 is turned on. A bias 73 applied by the capacitor 67 can drive current through the channel 56. However, in doing so the capacitor 67 discharges, thereby resulting in a current spike 74.

Thus, using a capacitor 67 can allow transistors 54 to fire spontaneously and asynchronously and so mimic neuronal behaviour more closely.

It will be appreciated that many modifications may be made to the embodiments hereinbefore described without departing from the spirit and scope of the invention. For example, voltage pulses need not be of uniform magnitude over the duration of the pulse, but can be vary, e.g. as a spike. Transistors need not be formed in single layer, but can be formed in multiple layers with interconnects ("vias") connecting different layers. A nanowire may be in the form of a nanotube. The nanowire may be arranged perpendicular to the substrate.

What is claimed is:

1. An apparatus comprising:
a nanowire comprising a channel and a charge trapping region configured to control conductivity of the channel;
at least one gate configured to apply electric fields to the nanowire; and
a pulse generator configured to apply voltage pulses to the at least one gate so to apply a first electric field pulse to the nanowire, the pulse generator configured to apply the first electric field pulse having a first polarity and a relatively large magnitude of integral of electric field in the time domain during the pulse and, thereafter, to apply at least one further electric field pulse to the nanowire, each further electric pulse having a second, opposite polarity and each respective further electric field pulse having a relatively small magnitude of integral of electric field in the time domain during the pulse.

2. The apparatus according to claim 1, comprising:
a bias generator configured to drive current through the channel after application of the voltage pulses.

3. The apparatus according to claim 1, wherein the charge trapping region is disposed at a surface of the nanowire.

4. The apparatus according to claim 1, wherein the charge trapping region includes charge trapping centres.

5. The apparatus according to claim 4, wherein the charge trapping centres comprise surface states on the surface of the channel.

6. The apparatus according to claim 4, wherein the charge trapping centres comprise interface states between the channel and an insulating material.

7. The apparatus according to claim 4, wherein the charge trapping centres comprise ion impurities.

8. The apparatus according to claim 1, wherein the charge trapping region includes an insulating material.

9. The apparatus according to claim 1, wherein the channel comprises a semiconductor material.

10. The apparatus according to claim 9, wherein the semiconductor material is crystalline.

11. The apparatus according to claim 9, wherein the semiconductor material comprises silicon.

12. The apparatus according to claim 9, wherein the charge trapping region includes a compound of the semiconductor material.

13. The apparatus according to claim 1, wherein the nanowire has a smallest dimension of less than 1 µm.

14. The apparatus according to claim 13, wherein the nanowire has a smallest dimension no more than 100 nm.

15. The apparatus according to claim 1, wherein the at least one gate includes a back gate.

16. The apparatus according to claim 1, wherein the at least one gate includes a top gate.

17. The apparatus according to claim 1, wherein the at least one gate includes a side gate.

18. The apparatus according to claim 1, wherein the pulse generator includes at least one other nanowire operatively connected to the at least one gate.

19. The apparatus according to claim 1, further comprising a capacitor configured to drive current through the channel after application of the at least one further electric pulses.

20. An apparatus comprising:
at least two nanowires, each nanowire comprising a channel and a charge trapping region configured to control conductivity of the channel,
at least two gates, each gate configured to apply an electric field to a respective nanowire; and
at least one conductive element configured to be switchable between at least two non-volatile conductive states, wherein each conductive element is configured to pass a signal from at least one nanowire to a gate of another nanowire.

21. The apparatus according to claim 20, further comprising:
at least one further gate configured to apply an electric field to the at least two nanowires.

22. The apparatus according to claim 20, further comprising:
at least two capacitors, each capacitor configured to discharge through the channel of a respective nanowire.

23. An apparatus comprising:
a nanowire comprising a channel and a charge trapping region configured to control conductivity of the channel;
at least one gate configured to apply electric fields to the nanowire; and
means for applying voltage pulses to the at least one gate so to apply a first electric field pulse to the nanowire, the first electric field pulse having a first polarity and a relatively large magnitude of integral of electric field in the time domain during the pulse and, thereafter, for applying at least one further electric field pulse to the nanowire, each further electric pulse having a second, opposite polarity and each respective further electric field pulse having a relatively small magnitude of integral of electric field in the time domain during the pulse.

* * * * *

UNITED STATES PATENT AND TRADEMARK OFFICE
CERTIFICATE OF CORRECTION

PATENT NO. : 8,232,544 B2
APPLICATION NO. : 12/080790
DATED : July 31, 2012
INVENTOR(S) : Colli It is certified that error appears in the above-identified patent and that said Letters Patent is hereby corrected as shown below:

In the Specifications:

Column 6,
Line 64, "The hysteric response" should read --The hysteretic response--.

Column 7,
Line 35, "the hysteric behaviour" should read --the hysteretic behaviour--.

Column 8,
Line 59, "hysteric behaviour" should read --hysteretic behaviour--.

Column 9,
Line 60, "tunable" should read --tuneable--.

Signed and Sealed this
Thirtieth Day of April, 2013

Teresa Stanek Rea
*Acting Director of the United States Patent and Trademark Office*